Figure 1:
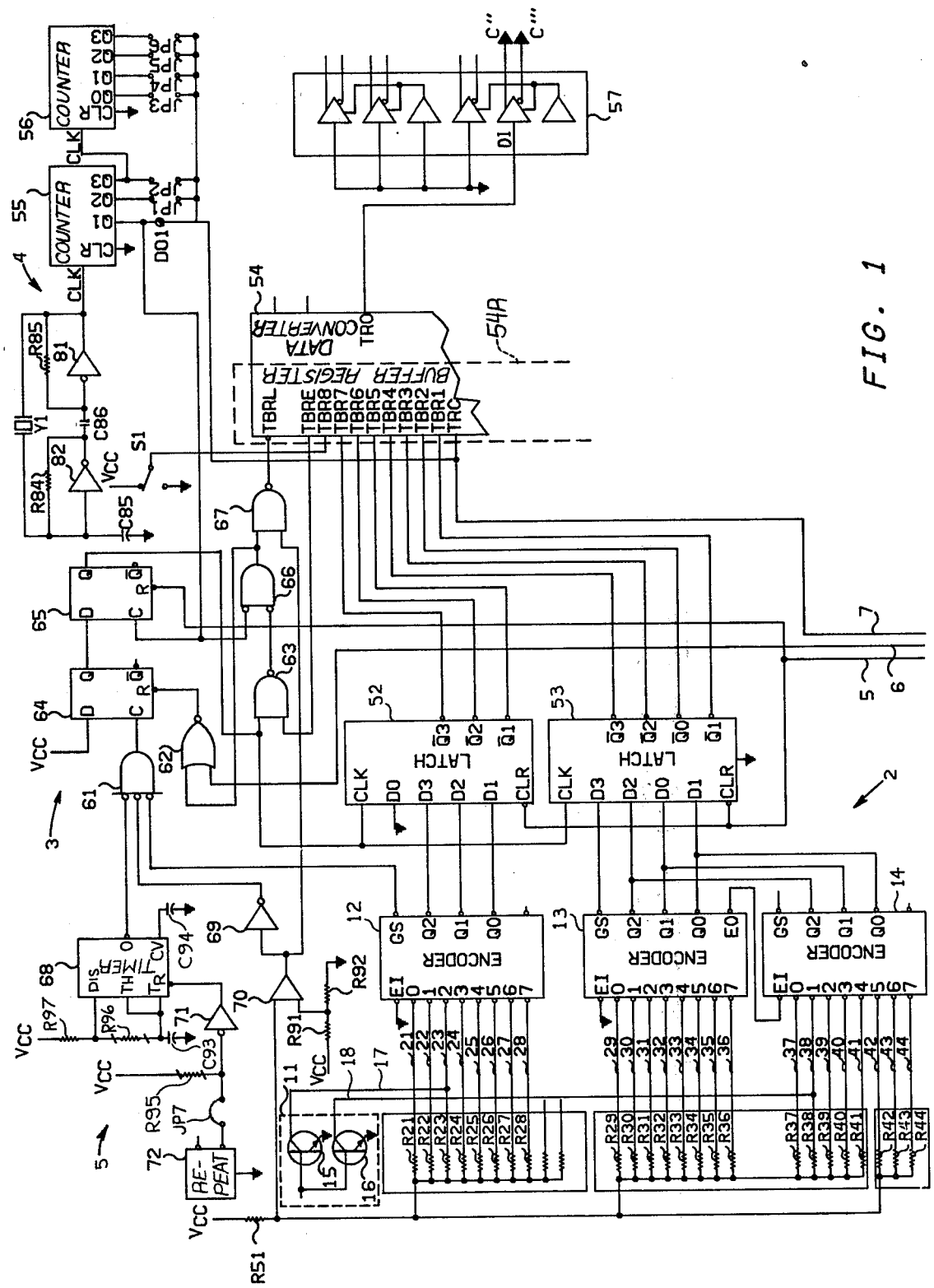

United States Patent [19]

Macy

[11] 4,346,369
[45] Aug. 24, 1982

[54] KEYBOARD ENCODER-DECODER

[75] Inventor: Edward K. Macy, Dewey, Okla.

[73] Assignee: Phillips Petroleum Company, Bartlesville, Okla.

[21] Appl. No.: 80,594

[22] Filed: Oct. 1, 1979

[51] Int. Cl.³ .............................................. G06F 3/02
[52] U.S. Cl. ............................. 340/365 S; 178/17 C; 340/365 E
[58] Field of Search ............ 340/365 S, 365 E, 365 L, 340/365 R, 168 R, 168 B; 178/17 C, 90 K; 361/193; 84/1.01; 400/479, 472, 479.2

[56] References Cited

U.S. PATENT DOCUMENTS

| | | | |
|---|---|---|---|
| 2,871,289 | 1/1959 | Cox et al. | 340/365 E |
| 3,493,928 | 2/1970 | Juliusburger | 340/365 E |
| 3,623,082 | 11/1971 | Stein et al. | 340/365 S |
| 3,781,874 | 12/1973 | Jennings | 340/365 S |
| 3,928,789 | 12/1975 | Elias | 340/365 S |
| 3,932,838 | 1/1976 | Sitter | 340/365 E |
| 4,072,820 | 2/1978 | Gunther | 340/365 S |
| 4,170,768 | 10/1979 | Kitagawa | 340/365 S |

OTHER PUBLICATIONS

Components Report XII, "Integrated Circuits", May 1977, No. 2, p. 54.

Primary Examiner—James J. Groody

[57] ABSTRACT

A keyboard encoder/decoder and method is provided for encoding on a keyboard output into a serial format data word representative of one and only one actuated key for transmission to an external device, and for decoding a serial format data word received from the external device. In a specific embodiment, a highest priority encoder output in parallel format is translated into a serial word format representative of one and only one actuated key. A repeat feature is also disclosed.

13 Claims, 2 Drawing Figures

KEYBOARD ENCODER-DECODER

FIELD OF THE INVENTION

The invention relates to keyboard encoding. In another aspect the invention relates to keyboard encoding and keyboard decoding. In a particular aspect, the invention relates to an apparatus and method for converting the output of a keyboard into a serial binary form. In another particular aspect the invention relates to apparatus and method for encoding the outputs of the Hall-effect type switches. In yet another aspect, the invention relates to an apparatus and method for reducing errors caused by the depressing of more than one keyboard switch simultaneously.

BACKGROUND OF THE INVENTION

A keyboard is a primary means of communication between persons and machines such as computers. For example, a keyboard can be used to provide an input, for example, to a computer or to the logic unit of, for example, a process controller. Such keyboards can include, for example, control keyboards suitable for installation in a petroleum, petrochemical, or chemical process plant. However, to accomplish this interfacing function between persons and machines, it is necessary that keys representing a particular instruction be translated to the data format of the computer, for example, to binary form. Generally, this involves translating, for example, alphanumeric significations assigned to keys on a keyboard and having meaning for a human operator to binary form for processing by a digital computer. For example, on a keyboard suitable for installation in a petroleum, petrochemical, or chemical process plant, such keyboards can include keys to "enter set points", "enter controller tuning constants", "enter alarm limits", "transfer control loops", and the like.

Such keyboards can be utilized in environments characterized as hazardous because of the presence of volatiles or inflammables for example, in petroleum plants, petrochemical plants, and other plants. In such circumstances, it can be desirable that the keyboard unit be located at a considerable distance from the computer and have design features furthering safety. To facilitate transmission of binary data from a keyboard to a computer processing unit, it is desirable to convert the binary word into serial form. To further safety, it is desirable that the keyboard encoder be so far as possible, intrinsically safe. Further since such a keyboard encoder is located at a considerable distance from the computer processing unit it is desirable that the keyboard also be capable of decoding binary form data words from the processing unit into signs or signals having signification for the human operator so that two way communication between the keyboard operator and the processing unit is achieved.

To further safety, as indicated, it is desirable that intrinsically safe components be utilized. Hall effect type switches have been developed which do not rely on a metallic contact closure to connect to signal lines. Such switches are capable of supplying two arc-free bounceless outputs without generating radio frequency interference. This type of switch acts as a current sink for two signal lines. The fact that no physical contact is required by the Hall effect type switches enhances the life and the reliability of the keyboard itself by virtue of the fact that there is no contact erosion or bounce. It is thus desirable to use Hall effect type switches in keyboard systems. However, it has been difficult in the past to interface a keyboard using Hall effect type switches to a computer in serial binary format.

In addition, where a keyboard is utilized, for example, to control the logic processor of, for example, a process controller, it is highly desirable so far as possible that only valid data in a valid format be encoded and transmitted to the processor. By the term "valid data" is meant that the data encoded is the instruction intended by the human operator. By the term "valid format" is meant that the data is in proper form for processing by, for example, a logic processor whether or not the data is valid data.

It can readily be appreciated that a frequent source of invalid data is the simultaneous or near simultaneous depressing of two or more keyboard switches on a switchboard. Such multiple key actuation can, in some keyboard encoders, result in transmission of a composite binary data word which is not representative of any of the actuated keys.

Accordingly, an object of the invention is apparatus and method for encoding the output of a keyboard into serial binary form. A further object is such an apparatus and method capable of transmitting and receiving serial binary data to an external device. A yet further object is such an apparatus and method functional for decoding the thus received binary serial data. Another object is apparatus and method for reducing errors caused by the simultaneous or near simultaneous depression of more than one key. Yet another object is such an encoder decoder which can operate from a single power supply and which can be operated at a considerable distance from the external device with which it is in communication. Yet another object is such an apparatus and method which is well adapted for its intended use. Other objects and advantages of the invention can appear to one skilled in the art from a consideration of the following description and the drawings.

BRIEF DESCRIPTION OF THE INVENTION

Briefly, the invention comprises a keyboard encoder comprising a plurality of keyboard switches; and means responsive to a detected condition that at least one and only one keyboard switch is actuated for selectively generating a binary data word in serial format representative of an actuated switch.

In another aspect, the invention comprises a method for encoding the output of a keyboard having a plurality of keyboard switches, the method comprising actuating at least one of the plurality of keyboard switches; and generating a serial format binary word representative of a thus actuated keyboard switch responsive to a detected condition that at least one and only one keyboard switch is actuated.

In a preferred embodiment, the invention comprises apparatus for converting the output of a keyboard into serial form, the apparatus comprising a keyboard comprising a plurality of keyboard switches; means for generating a parallel format data word representative of at least one actuated keyboard switch; a latch means; means for loading a thus generated parallel format data word into the latch means responsive to a detected condition that at least one and only one keyboard switch is actuated; a parallel to serial data converter having a buffer register; means for loading a thus latched parallel format data word into the buffer register of a parallel-to-serial data converter responsive to a detected condition that the buffer register is empty and that at least one and only one keyboard switch is actuated; and means for converting the parallel format data word into a serial format data word.

In yet another aspect, a preferred embodiment comprises a method for converting the output of a keyboard into serial form, the method comprising actuating at least one keyboard switch, generating a parallel format data word representative of at least one thus actuated keyboard switch, loading a thus generated parallel format data word into a latch responsive to a detected condition that at least one and only one keyboard switch is actuated; loading a thus latched parallel format data word into a buffer register of a parallel-to-serial data converter responsive to a detected condition that the buffer register is empty and that at least one and only one keyboard switch is actuated; and converting the parallel format data word into a unique serial format data word.

In a further particular aspect of a preferred embodiment, the invention comprises: a voltage source, a first priority encoder means for generating a parallel binary output corresponding to a highest priority data line, and having a plurality of data inputs and a plurality of data outputs; means for electrically connecting the data inputs of the first priority encoder means to the voltage supply; a second priority encoder means for generating a binary output corresponding to a highest priority data line and having a plurality of data inputs and a plurality of data outputs; means for electrically connecting the data inputs of the second priority encoder to the voltage supply; a plurality of switching means, each of the plurality of switching means having at least two outputs and each of the plurality of switching means operable for effectively grounding a voltage source electrically connected to each of the at least two outputs; means for electrically connecting a first one of the outputs from each of the plurality of switching means to a respective one of the data inputs of the first priority encoder means; means for connecting a second one of the outputs from each of the plurality of switching means to a respective one of the data inputs of the second priority encoder means; means for combining the data outputs of the first priority encoder means with the data outputs of the second priority encoder means to form a combined binary output in serial format, closure of one of said plurality of switching means enabling generation of the combined binary output, the combined binary output being representative of the one of the plurality of switching means which is closed; and means for converting the combined binary output in parallel format to form a serial format data word representative of the one of the plurality of switching means which is actuated.

In a further particular aspect of a preferred embodiment, the invention comprises means for assuring that the serial format data word is representative of at least one closed switching means of said plurality of switching means.

In a further particular aspect of a preferred embodiment the invention comprises receiving means for receiving a serial format data word from an external device, means for converting a thus-received serial format data word into a parallel format data word, means for decoding the parallel format data word, and means to acknowledge receipt of the thus decoded data word.

Figure 2:
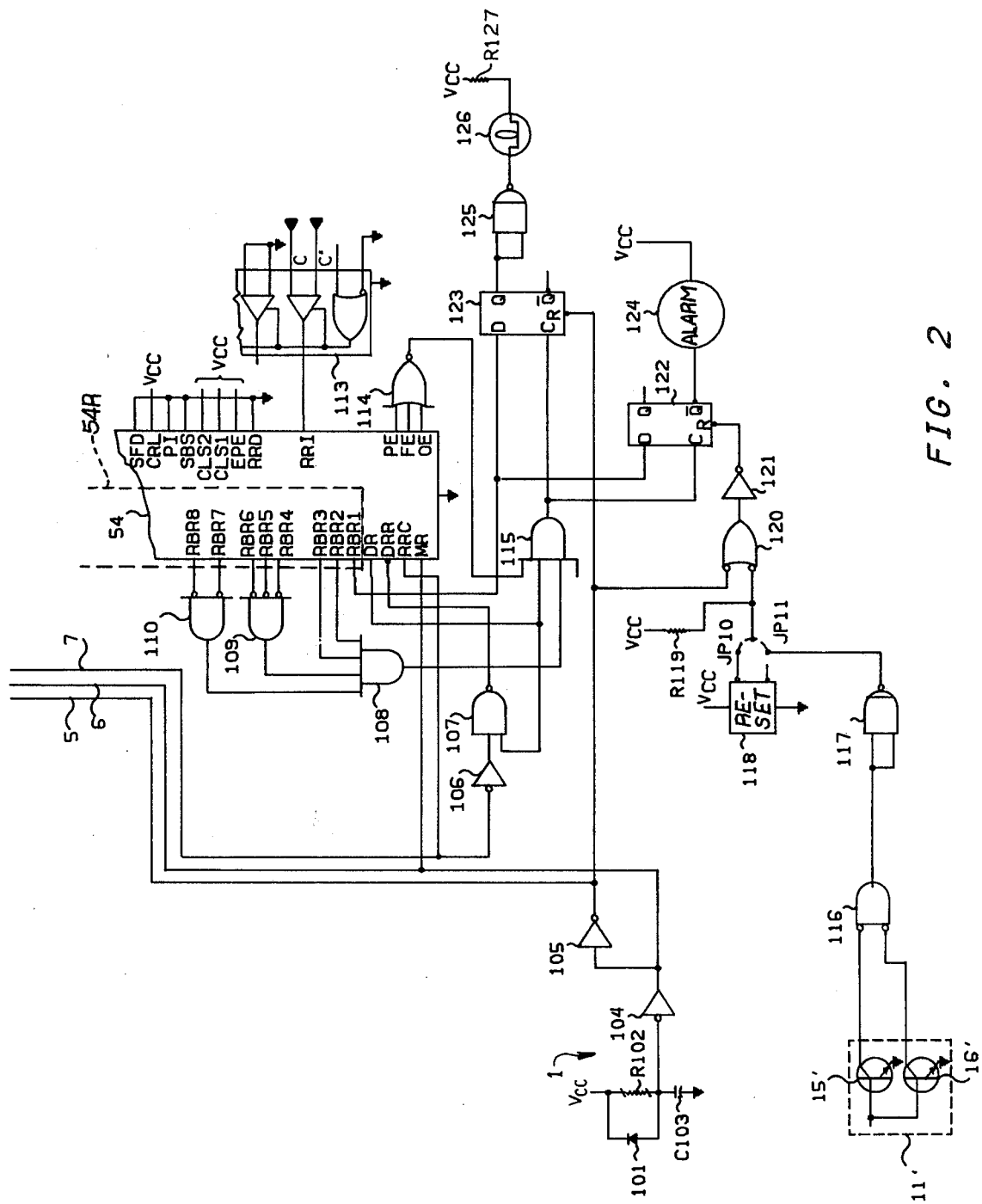

A better understanding of the invention can be derived from consideration of the following detailed description taken in conjunction with the accompanying drawings in which:

FIG. 1 is a partial, schematic of a keyboard encoder-decoder in accordance with one embodiment the invention showing primarily encoding and transmission circuitry and functions; and FIG. 2 is a partial schematic of a keyboard encoder-decoder in accordance with one embodiment of the invention showing primarily receiving and decoding functions.

The invention is described in terms of a particular electronics circuit which employs particular components. The invention is, however, applicable to different circuit configurations and is also applicable to circuits which employ different electrical components which accomplish the function or purpose of the electrical components set forth in the illustrated embodiment of the present invention.

The invention is also described in terms of an encoding system which can handle a keyboard having at least 128 keys or switches. However, only at least two keyboard switches are required to practice the invention and any suitable number of keyboard switches can be utilized in accordance with the principles of the invention.

The invention is also described in terms of Hall effect type switches which ground, i.e., act as current sinks for, particular signal lines. However, the invention is not limited to Hall effect type switches which act as current sources for particular signal lines but can be practiced in accordance with the invention with any suitable switch.

POWER-UP PULSE CIRCUITRY

The illustrated embodiment comprises power-up circuitry, designated generally by reference numeral 1 in FIG. 2 to set certain circuits to a proper state when power is applied to the encoder decoder. Thus, in FIG. 2, the power up circuit comprises a resistance-capacitance network comprising resistor R102 having a first lead tied to a voltage source Vcc and a second lead tied to a first lead of capacitor C103. Capacitor C103 also has a second lead tied to ground. Voltage source Vcc as used in referring to the illustrated embodiment refers to a single +5 VDC (volts-direct current) power supply (not shown). A discharge diode 101 has a cathode tied to the first lead of resistor R102 and an anode tied to the second lead of resistor R102. The second lead of resistor R102 is also tied to the input of an inverter 104. The output of inverter 104 is tied to a first input to NOR gate 62 on FIG. 1 via line 6. Referring again to FIG. 2, the output of inverter 104 is also tied to the master reset input MR of data converter 54. The output of inverter 102 is also tied to the input of inverter 105. The output of inverter 105 is tied to a first input of negated-input OR gate 120 and is also tied to the reset input R of visual alarm flip-flop 123. The output of inverter 105 is also tied via line 5 on FIG. 1 to reset inputs CLR of latch 52 and latch 53. The output of inverter 105 is also tied via line 5 on FIG. 1 to the reset input R of strobe flip-flop 65.

TRANSMITTER ENCODING CIRCUITRY

The illustrated embodiment comprises circuitry for encoding the output of a plurality of keyboard switches or keys, designated generally by reference numeral 2 on FIG. 1. Referring now to FIG. 1 in detail, reference numeral 11 designates the output stage of a Hall effect type switch which is preferably a 101 SN 11 manufactured by Microswitch. Only one switch is illustrated in FIG. 1 for the sake of simplicity. However, the illustrated embodiment, as further described in Table I hereinbelow, can handle as many as 128 switches. Each switch has two outputs 17 and 18. The plurality of switches each having a respective output stage 11 can be arranged in a matrix, for example, according to the illustrated embodiment, into a matrix comprising 16 rows and 8 columns with each switch having a respective output stage 11 having a first output tied to a column line, for example, any of column lines 21 through 28 inclusive, and a second output tied to a row line, for example, to any of row lines 29 through 44 inclusive provided that each switch output stage 11 has only one output 18 tied to a respective row line and each switch output stage 11 has only one output 17 tied to a respective column line.

Column lines 21 through 28 inclusive are tied to the inputs of priority encoder 12 at data input terminals 0 through 7 inclusive respectively. Row lines 29 through 36 inclusive are tied to the inputs of priority encoder 13 at data input terminals 0 through 7 inclusive respectively. Row lines 37 through 44 inclusive are tied to the inputs of priority encoder 14 at data input terminals 0 through 7 inclusive respectively.

Table 1 shows one possible configuration whereby a matrix of 128 switches comprising 8 columns and 16 rows can be tied to so that only one output 17 of each switch is tied to a unique input of priority encoder 12 and one output 18 of each switch is tied to a unique input of one of priority encoders 13 and 14 thereby permitting encoding of an actuated switch into a unique parallel format data word representative of the actuated switch.

TABLE I

| SWITCH | ENCODER 12 INPUT | | | | | | | | ENCODER 13 INPUT | | | | | | | | ENCODER 14 INPUT | | | | | | | |
|---|---|---|---|---|---|---|---|---|---|---|---|---|---|---|---|---|---|---|---|---|---|---|---|---|
| | 0 | 1 | 2 | 3 | 4 | 5 | 6 | 7 | 0 | 1 | 2 | 3 | 4 | 5 | 6 | 7 | 0 | 1 | 2 | 3 | 4 | 5 | 6 | 7 |
| 1 | X | | | | | | | | X | | | | | | | | | | | | | | | |
| 2 | X | | | | | | | | | X | | | | | | | | | | | | | | |
| 3 | X | | | | | | | | | | X | | | | | | | | | | | | | |
| 4 | X | | | | | | | | | | | X | | | | | | | | | | | | |
| 5 | X | | | | | | | | | | | | X | | | | | | | | | | | |
| 6 | X | | | | | | | | | | | | | X | | | | | | | | | | |
| 7 | X | | | | | | | | | | | | | | X | | | | | | | | | |
| 8 | X | | | | | | | | | | | | | | | X | | | | | | | | |
| 9 | X | | | | | | | | | | | | | | | | X | | | | | | | |
| 10 | X | | | | | | | | | | | | | | | | | X | | | | | | |
| 11 | X | | | | | | | | | | | | | | | | | | X | | | | | |
| 12 | X | | | | | | | | | | | | | | | | | | | X | | | | |
| 13 | X | | | | | | | | | | | | | | | | | | | | X | | | |
| 14 | X | | | | | | | | | | | | | | | | | | | | | X | | |
| 15 | X | | | | | | | | | | | | | | | | | | | | | | X | |
| 16 | X | | | | | | | | | | | | | | | | | | | | | | | X |
| 17 | | X | | | | | | | X | | | | | | | | | | | | | | | |
| 18 | | X | | | | | | | | X | | | | | | | | | | | | | | |
| 19 | | X | | | | | | | | | X | | | | | | | | | | | | | |
| 20 | | X | | | | | | | | | | X | | | | | | | | | | | | |
| 21 | | X | | | | | | | | | | | X | | | | | | | | | | | |
| 22 | | X | | | | | | | | | | | | X | | | | | | | | | | |
| 23 | | X | | | | | | | | | | | | | X | | | | | | | | | |
| 24 | | X | | | | | | | | | | | | | | X | | | | | | | | |
| 25 | | X | | | | | | | | | | | | | | | X | | | | | | | |
| 26 | | X | | | | | | | | | | | | | | | | X | | | | | | |
| 27 | | X | | | | | | | | | | | | | | | | | X | | | | | |
| 28 | | X | | | | | | | | | | | | | | | | | | X | | | | |
| 29 | | X | | | | | | | | | | | | | | | | | | | X | | | |
| 30 | | X | | | | | | | | | | | | | | | | | | | | X | | |
| 31 | | X | | | | | | | | | | | | | | | | | | | | | X | |
| 32 | | X | | | | | | | | | | | | | | | | | | | | | | X |
| 33 | | | X | | | | | | X | | | | | | | | | | | | | | | |
| 34 | | | X | | | | | | | X | | | | | | | | | | | | | | |
| 35 | | | X | | | | | | | | X | | | | | | | | | | | | | |
| 36 | | | X | | | | | | | | | X | | | | | | | | | | | | |
| 37 | | | X | | | | | | | | | | X | | | | | | | | | | | |
| 38 | | | X | | | | | | | | | | | X | | | | | | | | | | |
| 39 | | | X | | | | | | | | | | | | X | | | | | | | | | |
| 40 | | | X | | | | | | | | | | | | | X | | | | | | | | |
| 41 | | | X | | | | | | | | | | | | | | X | | | | | | | |
| 42 | | | X | | | | | | | | | | | | | | | X | | | | | | |
| 43 | | | X | | | | | | | | | | | | | | | | X | | | | | |
| 44 | | | X | | | | | | | | | | | | | | | | | X | | | | |
| 45 | | | X | | | | | | | | | | | | | | | | | | X | | | |
| 46 | | | X | | | | | | | | | | | | | | | | | | | X | | |
| 47 | | | X | | | | | | | | | | | | | | | | | | | | X | |
| 48 | | | X | | | | | | | | | | | | | | | | | | | | | X |
| 49 | | | | X | | | | | X | | | | | | | | | | | | | | | |
| 50 | | | | X | | | | | | X | | | | | | | | | | | | | | |
| 51 | | | | X | | | | | | | X | | | | | | | | | | | | | |
| 52 | | | | X | | | | | | | | X | | | | | | | | | | | | |
| 53 | | | | X | | | | | | | | | X | | | | | | | | | | | |
| 54 | | | | X | | | | | | | | | | X | | | | | | | | | | |
| 55 | | | | X | | | | | | | | | | | X | | | | | | | | | |
| 56 | | | | X | | | | | | | | | | | | X | | | | | | | | |
| 57 | | | | X | | | | | | | | | | | | | X | | | | | | | |

TABLE I-continued

| SWITCH | \multicolumn{8}{c}{ENCODER 12 INPUT} | \multicolumn{8}{c}{ENCODER 13 INPUT} | \multicolumn{8}{c}{ENCODER 14 INPUT} |
|---|---|---|---|---|---|---|---|---|---|---|---|---|---|---|---|---|---|---|---|---|---|---|---|---|
| | 0 | 1 | 2 | 3 | 4 | 5 | 6 | 7 | 0 | 1 | 2 | 3 | 4 | 5 | 6 | 7 | 0 | 1 | 2 | 3 | 4 | 5 | 6 | 7 |
| 58 |   |   |   | X |   |   |   |   |   |   |   |   |   |   |   |   |   | X |   |   |   |   |   |   |
| 59 |   |   |   | X |   |   |   |   |   |   |   |   |   |   |   |   |   |   | X |   |   |   |   |   |
| 60 |   |   |   | X |   |   |   |   |   |   |   |   |   |   |   |   |   |   |   | X |   |   |   |   |
| 61 |   |   |   | X |   |   |   |   |   |   |   |   |   |   |   |   |   |   |   |   | X |   |   |   |
| 62 |   |   |   | X |   |   |   |   |   |   |   |   |   |   |   |   |   |   |   |   |   | X |   |   |
| 63 |   |   |   | X |   |   |   |   |   |   |   |   |   |   |   |   |   |   |   |   |   |   | X |   |
| 64 |   |   |   | X |   |   |   |   |   |   |   |   |   |   |   |   |   |   |   |   |   |   |   | X |
| 65 |   |   |   |   | X |   |   |   | X |   |   |   |   |   |   |   |   | X |   |   |   |   |   |   |
| 66 |   |   |   |   | X |   |   |   |   | X |   |   |   |   |   |   |   |   | X |   |   |   |   |   |
| 67 |   |   |   |   | X |   |   |   |   |   | X |   |   |   |   |   |   |   |   | X |   |   |   |   |
| 68 |   |   |   |   | X |   |   |   |   |   |   | X |   |   |   |   |   |   |   |   | X |   |   |   |
| 69 |   |   |   |   | X |   |   |   |   |   |   |   | X |   |   |   |   |   |   |   |   | X |   |   |
| 70 |   |   |   |   | X |   |   |   |   |   |   |   |   | X |   |   |   |   |   |   |   |   | X |   |
| 71 |   |   |   |   | X |   |   |   |   |   |   |   |   |   | X |   |   |   |   |   |   |   |   | X |
| 72 |   |   |   |   | X |   |   |   |   |   |   |   |   |   |   | X |   | X |   |   |   |   |   |   |
| 73 |   |   |   |   | X |   |   |   | X |   |   |   |   |   |   |   |   |   | X |   |   |   |   |   |
| 74 |   |   |   |   | X |   |   |   |   | X |   |   |   |   |   |   |   |   |   | X |   |   |   |   |
| 75 |   |   |   |   | X |   |   |   |   |   | X |   |   |   |   |   |   |   |   |   | X |   |   |   |
| 76 |   |   |   |   | X |   |   |   |   |   |   | X |   |   |   |   |   |   |   |   |   | X |   |   |
| 77 |   |   |   |   | X |   |   |   |   |   |   |   | X |   |   |   |   |   |   |   |   |   | X |   |
| 78 |   |   |   |   | X |   |   |   |   |   |   |   |   | X |   |   |   |   |   |   |   |   |   | X |
| 79 |   |   |   |   | X |   |   |   |   |   |   |   |   |   | X |   |   |   |   |   |   |   |   | X |
| 80 |   |   |   |   | X |   |   |   |   |   |   |   |   |   |   | X |   |   |   |   |   |   |   | X |
| 81 |   |   |   |   |   | X |   |   | X |   |   |   |   |   |   |   |   | X |   |   |   |   |   |   |
| 82 |   |   |   |   |   | X |   |   |   | X |   |   |   |   |   |   |   |   | X |   |   |   |   |   |
| 83 |   |   |   |   |   | X |   |   |   |   | X |   |   |   |   |   |   |   |   | X |   |   |   |   |
| 84 |   |   |   |   |   | X |   |   |   |   |   | X |   |   |   |   |   |   |   |   | X |   |   |   |
| 85 |   |   |   |   |   | X |   |   |   |   |   |   | X |   |   |   |   |   |   |   |   | X |   |   |
| 86 |   |   |   |   |   | X |   |   |   |   |   |   |   | X |   |   |   |   |   |   |   |   | X |   |
| 87 |   |   |   |   |   | X |   |   |   |   |   |   |   |   | X |   |   |   |   |   |   |   |   | X |
| 88 |   |   |   |   |   | X |   |   |   |   |   |   |   |   |   | X |   |   |   |   |   |   |   | X |
| 89 |   |   |   |   |   | X |   |   | X |   |   |   |   |   |   |   |   | X |   |   |   |   |   |   |
| 90 |   |   |   |   |   | X |   |   |   | X |   |   |   |   |   |   |   |   | X |   |   |   |   |   |
| 91 |   |   |   |   |   | X |   |   |   |   | X |   |   |   |   |   |   |   |   | X |   |   |   |   |
| 92 |   |   |   |   |   | X |   |   |   |   |   | X |   |   |   |   |   |   |   |   | X |   |   |   |
| 93 |   |   |   |   |   | X |   |   |   |   |   |   | X |   |   |   |   |   |   |   |   | X |   |   |
| 94 |   |   |   |   |   | X |   |   |   |   |   |   |   | X |   |   |   |   |   |   |   |   | X |   |
| 95 |   |   |   |   |   | X |   |   |   |   |   |   |   |   | X |   |   |   |   |   |   |   |   | X |
| 96 |   |   |   |   |   | X |   |   |   |   |   |   |   |   |   | X |   |   |   |   |   |   |   | X |
| 97 |   |   |   |   |   |   | X |   | X |   |   |   |   |   |   |   |   | X |   |   |   |   |   |   |
| 98 |   |   |   |   |   |   | X |   |   | X |   |   |   |   |   |   |   |   | X |   |   |   |   |   |
| 99 |   |   |   |   |   |   | X |   |   |   | X |   |   |   |   |   |   |   |   | X |   |   |   |   |
| 100 |   |   |   |   |   |   | X |   |   |   |   | X |   |   |   |   |   |   |   |   | X |   |   |   |
| 101 |   |   |   |   |   |   | X |   |   |   |   |   | X |   |   |   |   |   |   |   |   | X |   |   |
| 102 |   |   |   |   |   |   | X |   |   |   |   |   |   | X |   |   |   |   |   |   |   |   | X |   |
| 103 |   |   |   |   |   |   | X |   |   |   |   |   |   |   | X |   |   |   |   |   |   |   |   | X |
| 104 |   |   |   |   |   |   | X |   |   |   |   |   |   |   |   | X |   |   |   |   |   |   |   | X |
| 105 |   |   |   |   |   |   | X |   | X |   |   |   |   |   |   |   |   | X |   |   |   |   |   |   |
| 106 |   |   |   |   |   |   | X |   |   | X |   |   |   |   |   |   |   |   | X |   |   |   |   |   |
| 107 |   |   |   |   |   |   | X |   |   |   | X |   |   |   |   |   |   |   |   | X |   |   |   |   |
| 108 |   |   |   |   |   |   | X |   |   |   |   | X |   |   |   |   |   |   |   |   | X |   |   |   |
| 109 |   |   |   |   |   |   | X |   |   |   |   |   | X |   |   |   |   |   |   |   |   | X |   |   |
| 110 |   |   |   |   |   |   | X |   |   |   |   |   |   | X |   |   |   |   |   |   |   |   | X |   |
| 111 |   |   |   |   |   |   | X |   |   |   |   |   |   |   | X |   |   |   |   |   |   |   |   | X |
| 112 |   |   |   |   |   |   | X |   |   |   |   |   |   |   |   | X |   |   |   |   |   |   |   | X |
| 113 |   |   |   |   |   |   |   | X | X |   |   |   |   |   |   |   |   | X |   |   |   |   |   |   |
| 114 |   |   |   |   |   |   |   | X |   | X |   |   |   |   |   |   |   |   | X |   |   |   |   |   |
| 115 |   |   |   |   |   |   |   | X |   |   | X |   |   |   |   |   |   |   |   | X |   |   |   |   |
| 116 |   |   |   |   |   |   |   | X |   |   |   | X |   |   |   |   |   |   |   |   | X |   |   |   |
| 117 |   |   |   |   |   |   |   | X |   |   |   |   | X |   |   |   |   |   |   |   |   | X |   |   |
| 118 |   |   |   |   |   |   |   | X |   |   |   |   |   | X |   |   |   |   |   |   |   |   | X |   |
| 119 |   |   |   |   |   |   |   | X |   |   |   |   |   |   | X |   |   |   |   |   |   |   |   | X |
| 120 |   |   |   |   |   |   |   | X |   |   |   |   |   |   |   | X |   |   |   |   |   |   |   | X |
| 121 |   |   |   |   |   |   |   | X | X |   |   |   |   |   |   |   |   | X |   |   |   |   |   |   |
| 122 |   |   |   |   |   |   |   | X |   | X |   |   |   |   |   |   |   |   | X |   |   |   |   |   |
| 123 |   |   |   |   |   |   |   | X |   |   | X |   |   |   |   |   |   |   |   | X |   |   |   |   |
| 124 |   |   |   |   |   |   |   | X |   |   |   | X |   |   |   |   |   |   |   |   | X |   |   |   |
| 125 |   |   |   |   |   |   |   | X |   |   |   |   | X |   |   |   |   |   |   |   |   | X |   |   |
| 126 |   |   |   |   |   |   |   | X |   |   |   |   |   | X |   |   |   |   |   |   |   |   | X |   |
| 127 |   |   |   |   |   |   |   | X |   |   |   |   |   |   | X |   |   |   |   |   |   |   |   | X |
| 128 |   |   |   |   |   |   |   | X |   |   |   |   |   |   |   | X |   |   |   |   |   |   |   | X |

The particular switch having output stage 11 illustrated in FIG. 1, for example, is shown tied to input 2 of priority encoder 12 and to input 1 of priority encoder 14. Referring to Table I it appears that the illustrated switch represents switch 42 according to the configuration set out in Table I.

Closure of a switch turns on both of output NPN transistors 15 and 16 which effectively grounds a respective input of priority encoder 12 and a respective input of one of priority encoders 13 and 14. For example, referring to Table I, and FIG. 1, closure of switch 1 will effectively ground data input 0 of priority encoder 12 and data input 0 of priority encoder 13; closure of switch 2 will effectively ground data input 0 of priority encoder 12 and data input 1 of priority encoder 13, etc.

Each of priority encoders 12, 13 and 14 are, in the illustrated embodiment 8-line-to-3-line priority encoders with 3-state outputs. The priority encoders feature priority decoding of the inputs to insure that only the highest order data input is encoded. For example, if switch 1 and switch 17 are simultaneously depressed, then, referring to Table 1 and to FIG. 1, input 0 and input 1 of priority encoder 12 will be effectively grounded. However, only input 1 will be encoded because input 1 is the higher order data input. By utilizing priority encoders it is assured that the output of the encoder is representative of at least one of the actuated keyboard switches.

Because the output transistors 15 and 16 of the output stage 11 of a switch are open collectors, as shown, a pull-up resistor, in the illustrated embodiment a 1 K Ohm resistor, is required on each column line and on each row line. A resistor R51, which has a first lead to voltage source Vcc, has a second lead tied to a first lead of each of resistors R21 through R44 inclusive. Each of resistors R21 through 28 inclusive has a respective second lead tied to column lines 21 through 28 inclusive respectively. Each of resistors R29 through R44 inclusive has a respective second lead tied to row lines 29 through 44 inclusive respectively. The second lead of resistor R51 is also tied to a first input of voltage comparator 70 which functions, as described in greater detail below, to detect a keyboard status wherein two or more switches are simultaneously depressed. Further, by means of the network comprising resistors R51 and R21 through R44 inclusive and column and row lines 21 through 44 inclusive, each of the data inputs 0 through 7 inclusive of each of the priority encoders 12, 13, and 14 is tied to a voltage source Vcc.

Priority encoders 13 and 14 have cascading circuitry, comprising an enable input EI and an enable output EO, to enable octal expansion of the priority encoding feature. In the illustrated embodiment, the enable input EI of priority encoder 14 is tied to the enable output EO of priority encoder 13.

Priority encoders 12, 13, and 14 have tri-state data outputs Q0, Q1, and Q2. The tri-state output permits tying together respective outputs of the priority encoders 12, 13, or 14. Thus in the illustrated embodiment, data outputs Q0, Q1, and Q2 of priority encoder 13 are tied to data outputs Q0, Q1, and Q2 respectively of priority encoder 14. The priority encoders also have a group select output GS. The GS output of priority encoder 12 is tied to a first input to negated-input AND gate 61 and is used to generate a latch load strobe as hereinafter described in greater detail. The group select output GS of priority encoder 13 is tied to data input D3 of latch 53 and serves to indicate which of priority encoders 12 or 13 is activated and to generate the fourth bit TB4 of a seven bit data word comprising seven bits which can be designated for ease of reference as TB1 through TB7 respectively. The first three bits, TB1 through TB3 inclusive, of the seven bit data word are generated by the respectively tied together outputs Q0, Q1, and Q2 of priority encoders 13 and 14 respectively. The fourth bit TB4 is generated as described above by the GS output of priority encoder 13. The last three bits TB5 through TB7 respectively are generated by the Q0, Q1, and Q2 outputs of priority encoder 12.

The seven bit data word comprising TB1 through TB7 appears in parallel format at the data inputs of latch 52 and latch 53 respectively. TB1, TB2, TB3, and TB4 appear at data inputs D1, D0, D2, and D3 respectively of latch 53. TB5, TB6, and TB7 appear at data inputs D1, D2, and D3 of latch 52 respectively. The data thus appearing at the data inputs of latches 53 and 52 is loaded into the latch by a latch load strobe appearing at the clock input CLK of latch 52 and 53 and generated as described in greater detail below. The latched data appear at data outputs of the latches 52 and 53. TB1, TB2, TB3, and TB4 appear at data outputs $\overline{Q1}$, $\overline{Q0}$, $\overline{Q2}$, and $\overline{Q3}$, respectively of latch 53 and TB5, TB6, and TB7 appear at data outputs $\overline{Q1}$, $\overline{Q2}$, and $\overline{Q3}$ respectively of latch 52. The clock input CLK of latch 52 and of latch 53 are tied to the output Q of strobe flip flop 65. Data outputs $\overline{Q1}$, $\overline{Q0}$, $\overline{Q2}$, $\overline{Q3}$ of latch 53 are tied to transmitter buffer register inputs TBR1 through TBR4 inclusive respectively of data converter 54. Data outputs $\overline{Q1}$, $\overline{Q2}$, and $\overline{Q3}$ of latch 52 are tied to transmitter buffer register inputs TBR5 through TBR7 inclusive respectively of data converter 54. Thus the parallel format data word TB1 through TB7 appears at inputs TBR1 through TBR7 of data converter 54. Input TBR8 of data converter 54 can be tied as illustrated in FIG. 1 to a switch S1 having one terminal connected to ground and a second terminal connected to voltage source Vcc to provide a Switch function or a Mode function, if desirable, thereby forming an 8-bit parallel format data word at the inputs of data converter 54.

Data converter 54 is functional for converting parallel data into serial form and automatically adding start, parity, and stop bits. The transmitter section accepts parallel data and transmits it in serial form on the transmitter register output TR0. Data is loaded into the inputs TBR1 through TBR8 inclusive of the transmitter buffer register 54R by a logic zero on the transmitter buffer register load input TBR1. The transmitter buffer register load is tied to the output of NAND gate 67 which is a part of the logic circuitry, described in greater detail below, used to generate a transmitter buffer register load strobe to load the data converter and to further insure that valid data in a valid format is loaded into data converter 54. The transmitter register clock input TRC of data converter 54 is tied to output Q1 of counter 55 as described in more detail below. The transmitter buffer register empty output TBRE is a status line to indicate the status of the buffer register.

The following inputs of data converter 54 are tied to voltage source Vcc as shown in FIG. 2: control register load input CRL; first character length selected input CLS1; second character length selected input CL2; and even parity enable input EPE. The following inputs, also as shown in FIG. 2, are tied to ground: status flags disable input SFD; parity inhibit input PI; stop bit select input SBS; and receiver register disable input RRD.

Referring again to FIG. 1, the transmitter register output TR0 of data converter 54 is tied to input DI of transmitter driver 57. The two outputs C" and C''' of driver 57 can be connected to a transmission line for transmission of encoded data words in serial form to an external device, for example, to a logic processing unit of a computer (not shown).

CLOCK CIRCUITRY

The clock circuitry, designated generally by reference numeral 4 in FIG. 1, comprises a crystal oscillator and a divide-by-256 counter. The divide-by-256 counter comprises two divide-by-16 counters 55 and 56. Output Q3 of counter 55 is tied to the clock input CLK of counter 56. The clock input CLK of counter 55 is tied to each of the output of inverter 81, a first lead of resistor R85, and a first side of crystal Y1. The second side of crystal Y1 is tied to each of a first lead of resistor R84, the input to inverter 82, and a first lead of capacitor C85. A second lead of capacitor C85 is tied to ground. The output of inverter 82 is tied to a second lead of resistor R84 and to a first lead of capacitor C86. A second lead of capacitor C86 is tied to a second lead of resistor R85 and to the input of inverter 81.

In the preferred embodiment the output of the crystal oscillator appears as a clock signal at 19.2 K baud rate at the output Q1 of counter 55. The clock frequency at Q1 of counter 55 is 16 times the baud rate. Output Q1 of counter 55 is tied to the clock input C of strobe flip flop 65 and to a first input of negated-input AND gate 66. Output Q1 of counter 55 is also tied to the transmitter register clock input TRC of data converter 54 via drill-out junction D.0.1. Output Q1 of counter 55 also is tied via line 7 to FIG. 2 to the receiver register clock input RRC of data converter 54 and to the input of inverter 106. Outputs Q2 and Q3 of counter 55 are tied to jumper terminals JP1 and JP2 respectively. Outputs Q0, Q1, Q2, and Q3 of counter 56 are tied to jumper terminals JP3, JP4, JP5, and JP6, respectively.

TRANSMITTER CONTROL LOGIC

The control logic section, designated generally by reference numeral 3, comprises circuitry to detect depression of more than one key at the same time, circuitry to generate a latch load strobe, circuitry to generate a buffer register load strobe, and circuitry to inhibit these functions when more than one key is depressed at the same time.

The control logic section comprises voltage comparator 70 having a first input tied to the resistor network comprising R51 and R21 through R44 inclusive as described above. A second input of voltage comparator 70 is tied to a first lead of resistor R91 and to a first lead of resistor R92. The second lead of resistor R91 is tied to voltage source Vcc. The second lead of resistor R92 is tied to ground.

The output of voltage comparator 70 is tied to a first input of NAND gate 67 and is also tied to an input of inverter 69. The output of inverter 69 is tied to a second input of negated input AND gate 61. A first input of gate 61 is tied to the group select output GS of priority encoder 12 as described above. A third input of gate 61 is tied to the output 0 of timer 68 as described below in discussing the repeat-function circuitry.

The output of gate 61 is tied to the clock input C of data flip-flop 64. Data input D of data flip flop 64 is tied to a voltage source Vcc. Output Q of data flip-flop 64 is tied to the data input D of strobe flip flop 65. The clock input C to strobe flip flop 65 is tied to clock output Q1 of counter 55 as described above. The output Q of strobe flip-flop 65 is tied to a first input to NAND gate 63. A second input of NAND gate 63 is tied to the transmitter buffer register empty terminal TBRE of data converter 54. The output of gate 63 is tied to a second input of negated input AND gate 66. A first input of gate 66 is tied to output Q1 of counter 55 as described above. The output of gate 66 is tied to a second input of NOR gate 62. A first terminal of gate 62 is also tied to line 6 and to power up circuitry as discussed above. The output of gate 62 is tied to the reset input R of data flip-flop 64.

The output of gate 66 is also tied to a second input of NAND gate 67. A first input of NAND gate 67 is tied to the output of voltage comparator 70 as described above. The output of gate 67 is tied to the transmitter buffer register load input TBRL of data converter 54.

REPEAT FUNCTION CIRCUITRY

The repeat function circuitry designated generally by reference numeral 5 comprises a timer 68 operable to produce a pulse at regular intervals, for example, each ½ second so long as switch means 72 is actuated, jumper JP7, an inverter 71, and associated discrete electrical components.

Timer 68 is preferably an NE/SE 555 monolithic timing circuit. Discharge output DIS of timer 68 is tied to a first terminal of resistor R97 having a second terminal tied to voltage source Vcc. Threshold input TH and trigger input T are each tied to a first terminal of capacitor C93 and to a first terminal of resistor R96. Resistor R96 has a second terminal tied to the first terminal of resistor R97 and the discharge output DIS of timer 68. Capacitor C93 has a second lead tied to ground. Timer 68 has a control voltage input CV tied to a first lead of capacitor C94 which capacitor C94 has a second lead tied to ground. Timer 68 has an output terminal 0 tied to a third input of negated input AND gate 61. Timer 68 has a reset input R tied to the output of an inverter 71. The input of inverter 71 is tied to a first terminal of resistor R95 having a second terminal tied to voltage source Vcc. The input of inverter 71 is tied to a jumper connection JP7 which can be jumpered to an output of switch means 72.

RECEIVER CIRCUITRY

The receiver circuitry comprises a line receiver 113, a receiver portion of data converter 54, alarm indicators and associated receiver logic circuitry and alarm reset circuitry.

Line receiver 113 receives asynchronous serial data from, for example, a logic unit (not shown) at inputs C and C' of line receiver 113. The output R0 of line receiver 113 is tied to the receiver register input RRI of data converter 54.

Parity error output PE, framing error output FE, and overrun error output OE of data converter 54 are tied to the inputs of NOR gate 114. The output of NOR gate 114 is tied to the first input of AND gate 115.

The master reset MR input of data converter 54 is tied to power up pulse inverter 104. The receiver register clock input RRC of data converter 54 is tied to clock circuitry 4 at output Q1 of counter 55 on FIG. 1 by line 7. The data ready reset input DRR of data converter 54 is tied to the output of NAND gate 107. The data ready output DR of data converter 54 is tied to the first input of AND gate 107 and to the second input of AND gate 115. The second input of AND gate 107 is tied to the output of inverter 106 which has an input tied to clock circuitry 4 in FIG. 1 via line 7. Receiver buffer register first bit output RBR1 is tied to the data input D of visual alarm flip flop 123 and to the data input D of audible alarm flip flop 122. Receiver buffer register second bit output RBR2 and third bit output RBR3 are tied to respective inputs of AND gate 108. Receiver buffer register fourth bit output RBR4, fifth bit output RBR5, and sixth bit output RBR6 are tied to respective inputs of negated input AND gate 109. The output of gate 109 is tied to an input of gate 108. Receiver buffer registers seventh bit output RBR7 and eighth bit output RBR8 are tied to negated input AND gate 110. The output of gate 110 is tied to an input of AND gate 108. The output of gate 108 is tied to the third input of AND gate 115. The output of gate 115 is tied to the clock input C of visual alarm flip flop 123 and to the clock input C of audible alarm flip flop 122. The reset input of flip flop 123 is tied to power up inverter 105 output. The data output Q of flip flop 123 is tied to each of two inputs of AND gate 125 having an open collector output tied to visual alarm indicator 126 which is tied to power source Vcc via resistor R127.

The output of AND gate 115 is also tied to the clock input C of audible alarm flip flop 122. The data output Q of flip flop 122 is tied to audible alarm indicator 124 which is tied to power source Vcc. The reset input R of flip-flop 122 is tied to the output of inverter 121. The input of inverter 121 is tied to the output of NOR gate 120. The first input of gate 120 is tied to power up inverter 105 output. A second input of gate 120 is tied to resistor R119 which is tied to power source Vcc. The second input of gate 120 is also tied to jumper terminal JP10 and JP11. When JP10 is jumpered, the second input of gate 120 is tied to pushbutton switch 118 to provide a manual reset for the audible alarm 124. If jumper JP11 is jumpered, the second input of gate 120 is tied to the output of AND gate 117 having an open collector output. The inputs of gate 117 are tied to the output of negated input AND gate 116 which are tied, for example to the output stage 11' of a keyboard switch which can be a switch in the matrix of keyboard switches whereby when a switch having output stage 11' is depressed an acknowledge signal can be encoded and transmitted as described above with reference to transmitter circuitry and function to the logic unit to be decoded there.

The invention has been described in terms of a presently preferred embodiment as illustrated in FIG. 1 and FIG. 2. For convenience and simplicity signals which supply power to the various chips illustrated have usually been omitted. Voltage levels required by the various chips are specified by the manufacturer and are well known by those familiar with the art.

Many different circuit configurations can perform the functions required of the circuit illustrated in FIG. 1 and FIG. 2. FIG. 1 and FIG. 2 are illustrative of a particular circuit configuration which will perform the required functions. However the particular circuit configuration is not to be considered limiting of the described invention.

Specific components which are available commercially and which can be used in the practice of the invention as illustrated in FIG. 1 and FIG. 2 follow in Table II. Values of resistors and capacitors used in these particular circuits are also given. Again many combinations of circuit values, particularly in the area of resistance and capacitance values, are possible in accordance with the present invention.

TABLE II

| Component | Identification | Source |
|---|---|---|
| NAND Gate, 63,67,107,120 | SN74LS00N | Texas Inst., Dallas TX |
| NOR Gate, 62, 66, 110 & 116 | SN74LS02N | Texas Inst., Dallas TX |
| Hex Inverter, 69,71,81,82, 104,105,106,121 | SN74LS04N | Texas Inst., Dallas TX |
| AND Gate, 108 & 115 | SN74LS21N | Texas Inst., Dallas TX |
| NOR Gate, 61,109 & 114 | SN74LS27N | Texas Inst., Dallas TX |
| D Flip-Flop, 64,65,112 & 123 | SN74LS74N | Texas Inst., Dallas TX |
| D Flip-Flop, 52 & 53 | SN74LS175N | Texas Inst., Dallas TX |
| Priority Encoder, 12,13, & 14 | SN74LS348N | Texas Inst., Dallas TX |
| Counter, 55 & 56 | SN74LS393N | Texas Inst., Dallas TX |
| NAND Driver, 117 & 125 | SN75452BP | Texas Inst., Dallas TX |
| Timer, 68 | NE555V | Signetics, Synnyvale, CA |
| Line Driver, 57 | MC3487P | Motorola, Phoenix, AZ |
| Line Receiver, 113, 70 | AM26LS32PC | AMD, Sunnyvale, CA |
| UART, 54 | HD3-6402-9 | Harris, Melbourne, FL |
| Resistors, R21 thru R44,95,96 | 899-1-R1K | Beckman, Fullerton, CA |
| Resistors, R119, R102 | 898-3-R10K | Beckman, Fullerton, CA |
| Crystal, Y1 | 1.2288 MHz | International Crystal, Oklahoma City, OK |
| Mini-Sonalert, 124 | SC1.5 | Allied Electronics, Fort Worth, TX |
| Switch, S1 | T8201 | Cutler Hammer, New Haven, CT |
| Resistor, R51 | 402Ω, $\frac{1}{8}$ω, 1% | Ohmite, Skokie, IL |
| Resistor, R91 | 768Ω, $\frac{1}{8}$ω, 1% | Ohmite, Skokie, IL |
| Resistor, R92 | 825Ω, $\frac{1}{8}$ω, 1% | Ohmite, Skokie, IL |
| Resistors, R83, R84 | 2.2 KΩ, $\frac{1}{8}$ω, 5% | Ohmite, Skokie, IL |
| Resistor, R97 | 698KΩ, $\frac{1}{8}$ω, 1% | Ohmite, Skokie, IL |
| Resistor, R127 | 12Ω, 1ω, 5% | Ohmite, Skokie, IL |
| Diode, 101 | IN 4001 | Motorola, Phoenix, AZ |
| Capacitor, C85 | 15pf | Mallory, Indianapolis, IN |
| Capacitor, C86 | 0.01 μf | Mallory, Indianapolis, IN |
| Capacitor, C103 | 1 μf, 20N | Mallory, Indianapolis, IN |
| Hall Effect Switch, 11,72 | 101SN11 | Micro Switch, Freeport, IL |
| Lighted Switch, 126, 118 | 201SN1A2 | Micro Switch, Freeport, IL |

KEYBOARD ENCODER FUNCTION

The keyboard encoder comprises three priority encoder integrated circuits and a seven-bit latch. Each time a pushbutton switch is depressed, the encoder generates a seven-bit code and a strobe that is used by the control logic section to load the keyboard encoder latch and the data converter.

The keyboard encoder comprises three priority encoder integrated circuits 12, 13, and 14 and two latch integrated circuits 52 and 53 which serve as storage registers for the seven bit code generated by the keyboard encoder.

The seven bit code is generated as follows. Switch 11 in its illustrated embodiment is tied to row line 23 and column line 38. When switch 11 is depressed a logic zero appears at the output of transistors 15 and 16 of switch 11. The logic zero appears at input 2 of encoder 12 and input 1 of encoder 14.

Encoders 12, 13, and 14 are 8-line to 3-line priority encoders with 3-state outputs. The encoders feature priority decoding of the inputs to insure that only the highest order data line is encoded. Hence if two or more switches are simultaneously depressed, the seven bit code generated corresponds to the highest priority input to the priority encoders. When any of data inputs 0 to 7 of encoder 13 is at a logic zero, the enable output EO of encoder 13 is at a logic 1 which appears at the enable input EI of encoder 14 producing a high impedance output at Q0 to Q2 of encoder 14 thus achieving octal expansion of the encoder and maintaining the priority encoding feature.

At the same time, the GS output of encoder 13 is a logic 1. When none of data inputs 0 to 7 of encoder 13 is at a logic zero, the enable output EO of encoder 13 is at a logic O and encoder 14 is enabled. At the same time the GS output of encoder 13 is a logic zero. Thus the logic state of the GS output indicates which of encoders 13 and 14 are enabled. By thus cascading encoder 13 and encoder 14, a unique data word signal corresponding to each of the 128 possible switches can be generated.

As indicated, a unique seven bit code is generated for each switch depressed. The bits can be designated by reference indicators TB1 to TB7 corresponding to the inputs TBR1 to TBR7 of transmitter receiver 54. The priority encoders generate a binary output code corresponding to each of the eight inputs. If more than one input is active, the code of the highest priority input will be generated. The column lines 21 to 28 from the pushbutton are tied to one priority encoder 12 which generates the most significant three bits TB5 to TB7 of the seven bit code. The row lines are connected to the other two priority encoders 13 and 14 whose outputs, which are tri-state, can be tied together to encode the least significant three bits TB1 to TB3 of the seven-bit code. The remaining bit TB4 is generated by the group select output GS of priority encoder 13 which indicates which row encoder is activated.

As explained above, when a pushbutton switch 11 is depressed, one column line and one row line are activated. When the keyboard encoder detects this condition, it generates a unique seven bit code plus a group select signal GS from column priority encoder 12. The group select signal GS from encoder 12 is used by the control logic to produce a clock enable signal at output Q of data flip-flop 65 to load the seven bit code from the encoders 12, 13, and 14 into the latches 52 and 53. The discussion of control logic function below will describe this in greater detail.

CLOCK CIRCUITRY FUNCTION

In a preferred embodiment the clock circuitry comprises a crystal oscillator circuit which runs at 1.2288 MHz and two divide-by-16 counters 55 and 56. Counters 55 and 56 form a divide-by-256 counter which can be jumpered via JP1 to JP6 to provide a data transfer rate output to the TRC input of data converter 54 of 19.2 K, 9600, 4800, 2400, 1200, 600, or 300 baud. The counter is prestrapped for 19.2 K baud in its illustrated embodiment but the rate can be changed by drilling out the "drill out" D.0.1 and by adding a jumper into any of the other baud rate selection positions JP1 to JP6. The relationship of baud rates and jumpers can be as follows: JP1, 9600 baud; JP2, 4800 baud; JP3, 2400 baud; JP4, 1200 baud; JP5, 600 baud; and JP6, 300 baud. The 19.2 K baud rate on the output $Q_1$ of counter 55 is also used in the control logic, discussed below, for synchronously loading the latches 52 and 53 for the keyboard encoder thereby maintaining data validity. The selected baud rate is also used in the alarm decoder circuit, discussed below, to set up data converter 54 for incoming data.

The control section comprises random logic to direct the data presented to data converter 54. The control logic section comprises logic to generate a transmitter buffer load strobe at the output of gate 67 to the transmitter buffer register load input TBRL of transmitter receiver 54. The control logic section also comprises logic to generate a latch load strobe at output Q of strobe flip-flop 65 to the clock inputs CLK of keyboard encoder latches 52 and 53. The control logic also comprises means to generate a repetitive pulse for a repeat function and means to generate an inhibit signal if two or more push buttons are pushed at the same time.

As indicated the control logic section comprises logic to generate a latch load strobe for latches 52 and 53. When a single push button switch 11 is depressed a unique 7-bit code is generated by the encoders 12, 13, and 14. The group select output GS of encoder 12 goes from a logic 1 to a logic zero and is gated at negated input AND gate 61 with an inactive logic zero signal from the repeat pulse generator, discussed below, and a logic zero from comparator 70, discussed below. The gate 61 output clocks the data flip flop 64 to its active state wherein a logic 1 is presented to input D of the strobe flip-flop 65. On the rising edge of the next pulse from the 19.2 K baud output of the clock circuitry at input C of flip-flop 65, flip-flop 65 is clocked active to generate the latch load strobe appearing at output Q of flip flop 65 and tied to the clock inputs CLK of latches 52 and 53.

As indicated, the control logic section also comprises logic to generate a transmitter load strobe to data converter 54. This function is attained by gating the latch load strobe generated as described above also to NAND gate 63 with a transmitter buffer register empty (TBRE) signal from terminal TBRE of data converter 54, which is a status line indicating the condition of data converter 54. When the UART is ready to receive data, TBRE is at logic 1 and is gated with the latch load strobe describe above to NAND gate 63. A logic zero appears at the output of NAND gate 63 and is tied to an input of negated-input AND gate 66 with the 19.2 K baud clock to produce a data flip-flop reset pulse to reset the data flip-flop 64 via gate 62. The data flip flop reset pulse is also gated with the output of comparator 70 (which is at logic zero when only one pushbutton switch 11 is depressed as described in more detail below) to generate the transmitter buffer register load strobe tied to TBRL of data converter 54.

After data flip-flop 64 has been reset, the strobe flip flop 65 will be clocked to its reset or inactive state on the next positive going edge of the 19.2 K baud rate pulse appearing at input C of strobe flip-flop 65. Thus, the latch load strobe circuitry and the transmitted load strobe circuitry have completed one cycle.

As indicated, the control logic also comprises means to generate a repetitive pulse for a repetitive function. The repeat function comprises a pushbutton switch 72 and a timer circuit 68 with associated discrete components as discussed above. When the repeat switch 72 is depressed, the timer 68 is enabled to generate a pulse at spaced intervals, in the preferred embodiment, each half-second. The repeat function is inhibited unless one of the other pushbutton switches 11 is depressed by gating the group select output GS of encoder 12 to negated input AND gate 61 with the repeat pulse.

As indicated, the control logic also comprises multi-key detector means to generate an inhibit signal if two or more pushbutton switches are depressed at the same time. The multikey detector means comprises two functions, one of which is to inhibit the transmission of a data word from data converter 54 when two or more pushbutton switches 11 are simultaneously depressed and the other of which is to initiate a load strobe sequence to generate a latch load strobe and a transmitter load strobe as described above as soon as only one pushbutton remains depressed, i.e., as soon as all pushbuttons but one are released.

The multi-key detector comprises a voltage detector 70 having a minus (−) input and a plus (+) input. The minus input is connected to the voltage divider comprising resistors R91 and R92 which is used to produce a voltage reference of 2.54 V for the comparator 70. The plus (+) input is tied to the resistor network comprising resistors R51 and pull-up R21 to R44. When two or more pushbutton switches 11 are depressed, a voltage divider network is formed by R51 and the paralleled value of two or more of the resistors of R21 and R44 pulled to ground by the depressed pushbutton switches, and, also, the internal resistance of the plus (+) input to comparator 70. The comparator 70 of the illustrated embodiment has a ±0.2 V maximum differential threshold voltage. With, for example, two switches 11 depressed, either three or four of resistors R21 and R44 will be paralleled to ground. Since three resistors parallel to ground is the worst case, only that situation will be discussed. With three resistors parallel to ground, the voltage at the plus (+) input to comparator 70 is +2.3 V. Because the comparator has a ±0.2 V maximum differential threshold voltage, the output of the comparator 70 will switch to the off or logic zero state when the plus (+) input goes below the 2.54 V reference, thus inhibiting via gate 67 and gate 61 may transfer of data. However, when all but one of the depressed pushbuttons are released, the output comparator 70 switches back to the opposite (logic one) state and allows the data flip-flop 64 to be clocked to the active state to initiate the load strobe sequence.

DATA CONVERTER FUNCTION

The data converter 54 in the illustrated embodiment is a Universal Asynchronous Receiver Transmitter. The transmitter section receives the seven bit parallel code TB1-TB7 inclusive from the keyboard encoder latches 52 and 53 plus an additional signal TB8 which indicates which state switch S1 is in. By means of switch S1 two mode function can be achieved if desired. The eight bit transmit word appearing at TBR1 to TBR8 is loaded into the data converter 54 with the transmitter load strobe from the control logic as described above, provided that the transmit buffer register of the UART is empty as indicated by the signal appearing at TBRE of data converter 54 as described above. Once loaded, TBRE changes logic states to inhibit loading of another word until the register is empty again. The transmitter section of the UART converts the eight bit parallel word into an eleven bit serial word which comprises one start bit, eight data bits, one even parity bit, and one stop bit. The serial data output TRO of data converter 54 is tied to the line driver 57 input C.

The functional keyboard receives asynchronous serial data from the logic unit of the video display (not shown) via the line receiver 113. Each serial character is eleven bits long and consists of four parts: a start bit; eight data bits; an even parity bit; and one stop bit.

The received serial data is supplied to the receiver register input RRI of a data converter 54. Data converter 54 converts the eleven bit serial data character into a parallel eight bit data word, three error status bits as described above and a data ready status bit. Decoder logic circuits, which consists of gates 108, 109, 110, 114 and 115, can decode two specific eight bit codes from the data converter 54 in addition to disabling the decoder if a transmission error has occurred.

Upon recognition of the specific codes 06 and 07, the decoder sets or resets flip-flops 122 and 123. All other codes are invalid. Code 07 sets flip-flops 122 and 123 which then activate visual and audible alarms. Code 06 resets flip-flops 122 and 123 which then deactivate the alarm indications. The visual alarm indicator can only be reset with an 06 code from the data converter. The audible alarm can be reset by the same code, but can also be reset by the manual alarm reset pushbutton 118, or an acknowledge pushbutton on the keyboard (not shown) depending on the position of the jumper on pushbutton switch 118.

As required a detailed description of preferred embodiments of the present invention is disclosed herein. However, it is to be understood that the disclosed embodiments are merely exemplary of the invention which can be embodied in various forms. Therefore specific structural and functional details as disclosed herein are not to be interpreted as limiting but merely as a basis for the claims and as a representative basis for teaching one skilled in the art to employ the present invention in any appropriate detailed structure.

I claim:
1. Apparatus for encoding comprising:
   a keyboard comprising a plurality of keyboard switches;
   parallel word generating means for generating a parallel format binary data word representative of only one actuated keyboard switch;
   serial word generating means for receiving said parallel format binary data word and generating in response thereto a serial format binary data word; and
   means for detecting that at least one and only one keyboard switch is actuated, said means for detecting having operably associated therewith
      means for permitting receipt of said parallel format binary data word by said serial word generating means only when at least one and only one keyboard switch is actuated, and
      means for permitting generation of said serial format binary data word to begin only when at least one and only one keyboard switch is actuated.

2. Apparatus in accordance with claim 1 wherein said means for detecting that at least one and only one keyboard switch is actuated comprises:
   a plurality of pull-up resistors associated with said keyboard switches;
   means for establishing a signal voltage by completing an electrical circuit through a predetermined first number of said pull-up resistors when at least one and only one keyboard switch is actuated and for establishing said signal voltage by completing said electrical circuit through a different number of said pull-up resistors in response to all other keyboard switch conditions; and
   means for comparing said signal voltage to a reference voltage and generating a detection signal in response to completion of said electrical circuit through said predetermined first number of said pull-up resistors.

3. Apparatus in accordance with claim 1 wherein said serial word generating means comprises a parallel-to-serial data converter means having a buffer register, said apparatus additionally comprising:
   a latch means;
   means for loading the generated parallel format binary data word into the latch means responsive to a detected condition that at least one and only one of the plurality of keyboard switches is actuated; and
   loading means for loading a thus latched parallel format binary data word into the buffer register of the parallel-to-serial data converter means, said loading means being adapted to be actuated responsive to a detected condition that the buffer register is empty and that at least one and only one keyboard switch is actuated.

4. Apparatus as in claim 3
   wherein each of the plurality of keyboard switches has at least two outputs;
   and wherein the means for generating a parallel format binary data word comprises:
   a voltage source;
   first priority encoder means for generating a parallel format binary output corresponding to a highest priority data input and having a plurality of data inputs and a plurality of data outputs;
   means for electrically connecting the data inputs of the first priority encoder means to voltage source;
   second priority encoder means for generating a parallel format binary output corresponding to a highest priority data input and having a plurality of data inputs and a plurality of data outputs;
   means for electrically connecting the data inputs of the second priority encoder means to the voltage source; and
   means for electrically connecting a first one of the outputs from each of the plurality of keyboard switches to a respective one of the data inputs of the first priority encoder means;
   means for electrically connecting a second one of the outputs from each of the plurality of keyboard switches to a respective one of the data inputs of the second priority encoder means.

5. Apparatus as in claim 4
   wherein the latch means comprises a plurality of data inputs, a plurality of data outputs, and a clock input to load data appearing at the data inputs of the latch means into the latch means; and further comprising
   means for electrically connecting a respective data input of the latch means to a respective data output of one of the first encoder means and the second encoder means;
   and wherein the means for loading a thus generated parallel format binary data word into the latch means comprises:
   means for generating a latch load strobe responsive to a detected condition that at least one and only one keyboard switch is actuated; and
   means for electrically connecting a thus generated latch load strobe to the clock input of the latch means.

6. Apparatus as in claim 5 wherein the means for detecting that at least one and only one keyboard switch is actuated comprises
   a voltage source
   a first resistor having a first lead and a second lead the first lead being tied to the voltage source
   a plurality of pull-up resistors, each of the plurality of pull-up resistors having a respective first lead and a respective second lead, each of the respective first leads being tied to the second lead of the first resistor, each respective second lead of each of the plurality of pull up resistors being tied to a respective data input of one of first priority encoder means and second priority encoder means
   a voltage comparator having at least a first input, a second input, and an output, the first input being tied to the second lead of the first resistor and
   a voltage dividing network comprising a second resistor having a first lead and a second lead, the first lead of the second resistor being tied to the voltage source, a third resistor having a first lead and a second lead, the first lead of the third resistor being tied to the second lead of the second resistor and to the second input of the voltage comparator, and the second lead of the third resistor being tied to ground 7. Apparatus as in claim 6
   wherein at least one of the first priority encoder means and the second priority encoder means has a group select output and the group select output is used to detect whether at least one switch is actuated.

8. Apparatus as in claim 7 wherein the means to generate a latch load strobe comprises:
   a first AND gate having at least a first input, a second input, and an output, the first input of the first AND gate being electrically connected to the output of the voltage comparator, and the second input of the first AND gate electrically connected to the gate select output;
   voltage source;
   a data flip-flop having a clock input, a data input, and a data output, the clock input being electrically connected to the output of the first AND gate, and the data input being electrically connected to the voltage source;
   clock means for generating a time pulse, the clock means having a baud rate output;
   a strobe flip-flop having a clock input, a data input, and a data output, the clock input of the strobe flip-flop being electrically connected to the baud rate output of the clock means, the data input of the strobe flip-flop being electrically connected to the data output of the data flip-flop, and the data output of the strobe flip-flop being electrically connected to the clock input of the latch means.

9. Apparatus as in claim 8 wherein the parallel-to-serial data converter means further comprises a buffer register empty status line and a buffer register load strobe input line;

and wherein the means for loading a thus-latched unique parallel format binary data word into the buffer register of the parallel-to-serial data converter means further comprises:
- a first NAND gate having a first input, a second input, and an output, the first input of the first NAND gate being electrically connected to the data output of the strobe flip-flop and the second input of the first NAND gate being electrically connected to the buffer register empty status line;
- a second AND gate having a first input, a second input, and an output, the first input of the second AND gate being electrically connected to the baud rate output of the clock means and the second input of the second AND gate being electrically connected to the output of the first NAND gate;
- a second NAND gate having a first input, a second input, and an output, the first input of the second NAND gate being electrically connected to the output of the voltage comparator, the second input of the second NAND gate being electrically connected to the output of the second AND gate and the output of the second NAND gate being electrically connected to the transmitter buffer register load strobe input line.

10. An apparatus as in claim 9 further comprising a line driver having an input and an output, the input of the line driver being electrically connected to an output of the data converter.

11. An apparatus as in claim 9 further comprising receiving means for receiving a serial format data word;
means for converting a thus-received serial format data word into a parallel format data word; and
means for decoding the parallel format data word.

12. A method for encoding, said method comprising actuating at least one keyboard switch on a keyboard comprising a plurality of said keyboard switches;
generating a parallel format binary data word representative of only one actuated keyboard switch;
latching a thus-generated parallel format binary data word responsive to a detected condition that at least one and only one keyboard switch is actuated;
loading a thus-latched parallel format binary data word into a buffer register of a parallel-to-serial data converter means responsive to a detected condition that the buffer register is empty and that at least one and only one keyboard switch is actuated; and
converting the parallel format binary data word into a serial format binary data word; said conversion beginning only in response to a detected condition that at least one and only one keyboard switch is actuated.

13. A method as in claim 12 further comprising:
generating a first highest priority input and a second highest priority input representative of only one of the thus actuated at least one keyboard switch
translating the first highest priority data input into a first parallel format binary output representative of the first highest priority data input;
translating the second highest priority data input into a second parallel format binary output representative of the second highest priority data input; and
combining in parallel format the first parallel format binary output and the second parallel format binary output to form a parallel format binary word representative of only one actuated switch.

* * * * *